United States Patent
Schmitt-Weaver et al.

(10) Patent No.: US 10,866,527 B2
(45) Date of Patent: Dec. 15, 2020

(54) METHODS AND APPARATUS FOR MONITORING A LITHOGRAPHIC MANUFACTURING PROCESS

(71) Applicant: ASML NETHERLANDS B.V., Veldhoven (NL)

(72) Inventors: Emil Peter Schmitt-Weaver, Eindhoven (NL); Kaustuve Bhattacharyya, Veldhoven (NL); Wim Tjibbo Tel, Helmond (NL); Frank Staals, Eindhoven (NL); Leon Martin Levasier, Hedel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/480,706

(22) PCT Filed: Jan. 3, 2018

(86) PCT No.: PCT/EP2018/050135
§ 371 (c)(1),
(2) Date: Jul. 25, 2019

(87) PCT Pub. No.: WO2018/149553
PCT Pub. Date: Aug. 23, 2018

(65) Prior Publication Data
US 2020/0004164 A1 Jan. 2, 2020

(30) Foreign Application Priority Data
Feb. 17, 2017 (EP) .................................. 17156769

(51) Int. Cl.
*G03F 7/20* (2006.01)
*G03F 9/00* (2006.01)

(52) U.S. Cl.
CPC ............ *G03F 7/7065* (2013.01); *G03F 7/705* (2013.01); *G03F 7/707* (2013.01);
(Continued)

(58) Field of Classification Search
CPC ...... G03F 7/70491; G03F 7/705; G03F 7/707; G03F 7/70616; G03F 7/70625;
(Continued)

(56) References Cited

U.S. PATENT DOCUMENTS 5,567,333 A * 10/1996 Hira ..................... G11B 5/3106
216/22
5,769,692 A * 6/1998 Pasch ..................... B24B 37/30
257/E21.23
(Continued)

FOREIGN PATENT DOCUMENTS

EP 1037117 9/2000
EP 1457828 9/2004

OTHER PUBLICATIONS

International Search Report and Written Opinion issued in corresponding PCT Patent Application No. PCT/EP2018/050135, dated Apr. 20, 2018.
(Continued)

*Primary Examiner* — Helen Rossoshek
(74) *Attorney, Agent, or Firm* — Pillsbury Winthrop Shaw Pittman LLP (57) ABSTRACT

A method for monitoring a lithographic process, and associated lithographic apparatus. The method includes obtaining height variation data relating to a substrate supported by a substrate support and fitting a regression through the height variation data, the regression approximating the shape of the substrate; residual data between the height variation data and the regression is determined; and variation of the residual data is monitored over time. The residual
(Continued)

data may be deconvolved based on known features of the substrate support.

20 Claims, 4 Drawing Sheets

(52) U.S. Cl.
CPC ...... *G03F 7/70616* (2013.01); *G03F 7/70783* (2013.01); *G03F 9/7026* (2013.01); *G03F 9/7034* (2013.01); *G03F 9/7092* (2013.01); *G03F 7/70491* (2013.01); *G03F 7/70691* (2013.01)

(58) Field of Classification Search
CPC ............... G03F 7/7065; G03F 7/70691; G03F 7/70783; G03F 9/7034; G03F 9/7026; G03F 9/7092
See application file for complete search history.

(56) References Cited

U.S. PATENT DOCUMENTS

| | | | | |
|---|---|---|---|---|
| 6,690,473 | B1 * | 2/2004 | Stanke | B24B 37/34 |
| | | | | 257/E21.53 |
| 6,790,688 | B2 * | 9/2004 | Raymond | G06T 5/20 |
| | | | | 382/261 |
| 7,012,672 | B2 * | 3/2006 | Van Rhee | G03F 7/70508 |
| | | | | 355/53 |
| 7,077,726 | B2 * | 7/2006 | Pietsch | H01L 21/02008 |
| | | | | 257/E21.23 |
| 7,333,174 | B2 * | 2/2008 | Koenen | B23D 43/04 |
| | | | | 355/53 |
| 7,649,614 | B2 * | 1/2010 | De Mol | G03F 7/70508 |
| | | | | 355/77 |
| 7,876,417 | B2 * | 1/2011 | Dowski, Jr. | G03F 7/70308 |
| | | | | 355/18 |
| 7,889,318 | B2 * | 2/2011 | De Mol | G03F 7/705 |
| | | | | 355/53 |
| 7,916,275 | B2 * | 3/2011 | De Mol | G03F 9/7034 |
| | | | | 355/53 |
| 8,149,384 | B2 * | 4/2012 | Chauhan | G03B 27/42 |
| | | | | 355/55 |
| 8,580,077 | B2 * | 11/2013 | Ogasawara | H01J 37/32935 |
| | | | | 156/345.24 |
| 8,792,085 | B2 * | 7/2014 | Puyt | G03F 7/707 |
| | | | | 355/53 |
| 8,908,148 | B2 * | 12/2014 | Geraets | G01N 21/93 |
| | | | | 355/52 |
| 8,946,631 | B2 * | 2/2015 | Noji | G01N 23/225 |
| | | | | 250/310 |
| 9,222,834 | B2 * | 12/2015 | Den Boef | G01J 3/4412 |
| 10,024,654 | B2 * | 7/2018 | Smith | G01B 11/161 |
| 10,025,193 | B2 * | 7/2018 | Cekli | G03F 7/70141 |
| 10,133,191 | B2 * | 11/2018 | Tel | G03F 7/705 |
| 10,274,370 | B2 * | 4/2019 | Den Boef | G01J 3/4412 |
| 2004/0239905 | A1 | 12/2004 | Van Rhee et al. | |
| 2005/0132306 | A1 * | 6/2005 | Smith | G06F 30/39 |
| | | | | 716/114 |
| 2006/0170892 | A1 | 8/2006 | Koenen et al. | |
| 2006/0279722 | A1 | 12/2006 | De Mol | |
| 2009/0073403 | A1 * | 3/2009 | De Mol | G03F 9/7003 |
| | | | | 355/53 |
| 2009/0153818 | A1 | 6/2009 | Chauhan et al. | |
| 2012/0013875 | A1 * | 1/2012 | Geraets | G01N 21/956 |
| | | | | 355/55 |
| 2013/0215404 | A1 * | 8/2013 | Den Boef | G01J 3/4412 |
| | | | | 355/44 |
| 2013/0339910 | A1 * | 12/2013 | Tyminski | G03F 1/70 |
| | | | | 716/52 |
| 2014/0127836 | A1 * | 5/2014 | Hsu | H01L 21/02697 |
| | | | | 438/14 |
| 2014/0368804 | A1 * | 12/2014 | Lafarre | G03F 7/70733 |
| | | | | 355/72 |
| 2015/0187663 | A1 * | 7/2015 | Hsu | H01L 21/31144 |
| | | | | 438/14 |
| 2015/0198898 | A1 * | 7/2015 | Shibazaki | G03F 9/7026 |
| | | | | 355/30 |
| 2015/0346609 | A1 * | 12/2015 | Den Boef | G03F 9/7026 |
| | | | | 355/77 |
| 2016/0109797 | A1 * | 4/2016 | Tanabe | G03F 7/20 |
| | | | | 430/5 |
| 2016/0148850 | A1 * | 5/2016 | David | G06N 7/005 |
| | | | | 438/5 |
| 2016/0334712 | A1 | 11/2016 | Cekli et al. | |
| 2017/0147733 | A1 * | 5/2017 | Rosenbluth | G03F 1/36 |
| 2017/0160648 | A1 * | 6/2017 | Tel | G03F 7/705 |
| 2019/0079411 | A1 * | 3/2019 | Cekli | G03F 7/70258 |
| 2019/0361358 | A1 * | 11/2019 | Tel | G03F 7/705 |

OTHER PUBLICATIONS

Taiwanese Office Action issued in corresponding Taiwanese Patent Application No. 107101941, dated Apr. 30, 2019.

* cited by examiner

METHODS AND APPARATUS FOR MONITORING A LITHOGRAPHIC MANUFACTURING PROCESS

CROSS-REFERENCE TO RELATED APPLICATIONS

This application is the U.S. national phase entry of PCT Patent Application No. PCT/EP2018/050135, which was filed on Jan. 3, 2018, which claims the benefit of priority of European patent application no. 17156769.6, which was filed on Feb. 17, 2017 and which is incorporated herein in its entirety by reference.

BACKGROUND

Field of the Invention

The invention relates to a monitoring method and apparatus for use in an industrial process. An example of an industrial process for which the apparatus has been developed is a lithographic manufacturing process, which includes one or more steps of transferring a pattern from a patterning device onto a substrate using a lithographic apparatus

Related Art

A lithographic process is a manufacturing process in which the lithographic apparatus applies a desired pattern onto a substrate, usually onto a target portion of the substrate. The patterning step performed by the lithographic apparatus is just one step in a sequence of processing steps performed on each substrate in the entire lithographic process. The processing steps generally include one or more pre-patterning process steps and one or more post-patterning process steps. Examples of pre-patterning steps include steps for applying or modifying layers of product material or mask material, applying a base anti-reflection coating (BARC) and applying a radiation-sensitive resist. Examples of post-patterning process steps include developing the resist, etching a product material or mask material in accordance with the pattern, removing resist, cleaning and so forth. Each substrate may pass through many cycles of patterning steps and processing steps, to build up a desired product structure.

Performance of the lithographic process can be measured by various parameters. A particular performance parameter known as overlay error or simply "overlay", relates to the ability to position successive layers of features in superposition accurately enough to produce working devices with a high yield. Overlay should, in general, be achieved within a few tens of nanometers in today's sub-micron semiconductor devices, down to a few nanometers in the most critical layers. Other performance parameters such as critical dimension (CD or line width) also should be optimized and made uniform across the substrate, to ensure good yield and performance of the manufactured devices. To achieve good performance in such parameters, the substrate should be stable and flat during the patterning step. Typically the substrate is held on a substrate support by a clamping force. Conventionally the clamping is achieved by suction. In the latest lithography tools using extreme ultraviolet (EUV) radiation, the patterning operation is conducted in a vacuum environment. In that case, the clamping force is achieved by electrostatic attraction.

As substrates move through a lithographic apparatus they will have their positions measured with substrate alignment and leveling metrology. This occurs after the substrate is clamped onto the substrate support and just before exposure. The intention is to characterize any unique substrate-to-substrate deviations. Deviations can come from several sources; error from substrate placement onto the substrate support, how the prior level's process has shaped the substrate surface, or if there is contamination on the backside of the substrate. Because the substrate is clamped onto the substrate support, any contamination between the substrate backside and the surface of the substrate holder or any non-uniform support characteristics may affect the substrates surface topography. While in operation, the physical models that control the substrate-to-substrate adjustments of the lithographic apparatus use the alignment and leveling metrology to consistently position each substrate correctly in order to achieve accurate patterning of the substrate.

Defects such as damage to the substrate support during clamping may cause the substrate to be distorted. In particular, it will be understood that the substrate support will degrade over time due to friction between its support surface and the back side of the substrate and/or the effect of chemicals (used in treatment of the substrate during one or more processing steps). This support surface may typically comprise multiple protrusions or burls, largely to mitigate the effect of intervening contaminant particles between substrate and support. One or more of these burls, or other aspects of the substrate support (particularly at the edge), may be affected by such deterioration, resulting in changes in its shape over time which will influence the shape of a substrate clamped thereon. The effects of this deterioration of the substrate support may be uncorrectable by existing control systems.

SUMMARY OF THE INVENTION

It would be desirable to monitor the degradation of the substrate support during production, in real time.

The present invention in a first aspect provides a method for monitoring a lithographic process, comprising: obtaining height variation data relating to a substrate supported by a substrate support; fitting a regression through the height variation data, said regression approximating the shape of the substrate; determining residual data representing the difference between the height variation data and the regression; and monitoring variation of said residual data over time.

The present invention in a second aspect provides a lithographic apparatus, comprising: a level sensor operable to measure height variation data relating to a substrate; a substrate support operable to support said substrate; and a processor operable to: fit a regression through the height variation data, said regression approximating the shape of the substrate; determine residual data representing the difference between the height variation data and the regression; and monitor variation of said residual data over time In another aspect, the present invention also provides a computer program product or other non-transient memory device, having stored there on software that when run on a computer causes the computer to carry out the method of the first aspect.

The computer program product may further contain instructions for specifically implementing any of the optional features, described above.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Before describing the techniques that are the specific subject of the present disclosure, it will be useful to present some background information on lithographic manufacturing processes and the issues arising therein. The examples will concern primarily processes for the production of functional devices on semiconductor substrates. The same principles can be applied to other types of product or substrates. It should also be appreciated in particular that the same principles can be applied in the manufacture of patterning devices such as reticles, which may themselves be used in a subsequent manufacturing process. Accordingly, references to the substrate in what follows may be construed also as references to a substrate on which a master pattern is to be formed, this being used subsequently for the applying functional device patterns to a series of substrates. The patterning device can be an optical lithography reticle, either transmissive or reflective in type. The patterning device may alternatively be a template for use in imprint lithography, for example.

Figure 1:
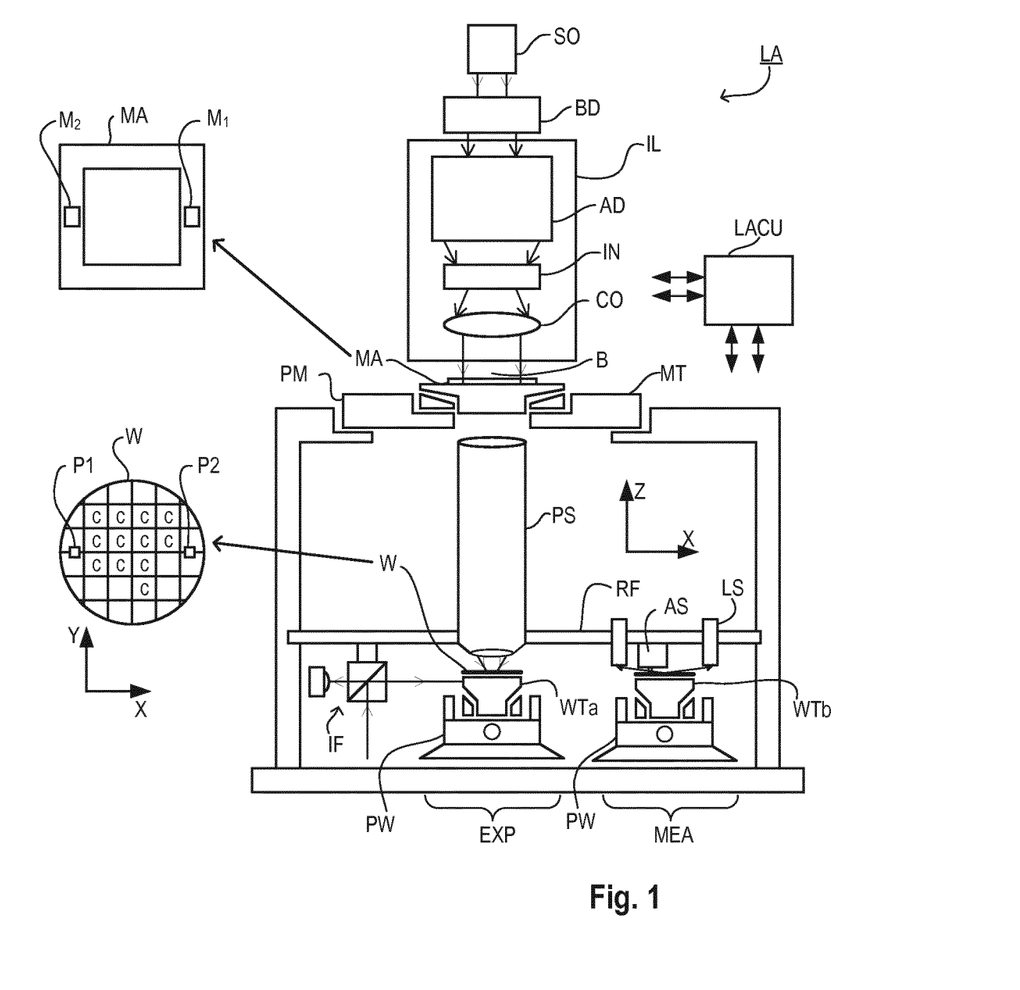
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate holder (e.g. a wafer table) WTa or WTb constructed to hold a substrate (e.g. a resist-coated substrate) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W. The substrate W, or wafer, has a front side, positioned uppermost during processing, onto which the various processing steps are incident, and a backside, opposite the front side and in contact with the substrate support WTa, WTb, during processing. The backside is vulnerable to contamination that may lead to the distortion of the front side, as described below.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate supports (and/or two or more mask tables). In such "multiple stage" machines the additional wafer tables may be used in parallel, or preparatory steps may be carried out on one or more wafer tables while one or more other wafer tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate support WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate support WTa/WTb are kept essentially stationary, while an entire pattern imparted to the radiation beam is projected onto a target portion C at one time (i.e. a single static exposure). The substrate support WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate support WTa/WTb are scanned synchronously while a pattern imparted to the radiation beam is projected onto a target portion C (i.e. a single dynamic exposure). The velocity and direction of the substrate support WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate support WTa/WTb is moved or scanned while a pattern imparted to the radiation beam is projected onto a target portion C. In this mode, generally a pulsed radiation source is employed and the programmable patterning device is updated as required after each movement of the substrate support WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate supports WTa and WTb and two stations—an exposure station and a measurement station—between which the substrate supports can be exchanged. While one substrate on one substrate support is being exposed at the exposure station EXP, another substrate can be loaded onto the other substrate support at the measurement station MEA so that various preparatory steps may be carried out. The preparatory steps may include mapping the surface height of the substrate using a level sensor LS and measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus LA is to print product features at the correct locations with very high accuracy. The measurement of alignment marks is therefore very time-consuming and the provision of two substrate supports enables a substantial increase in the throughput of the apparatus. If the position sensor IF is not capable of measuring the position of the substrate support while it is at the measurement station as well as at the exposure station, a second position sensor may be provided to enable the positions of the substrate support to be tracked at both stations. The invention can be applied in apparatus with only one substrate support, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
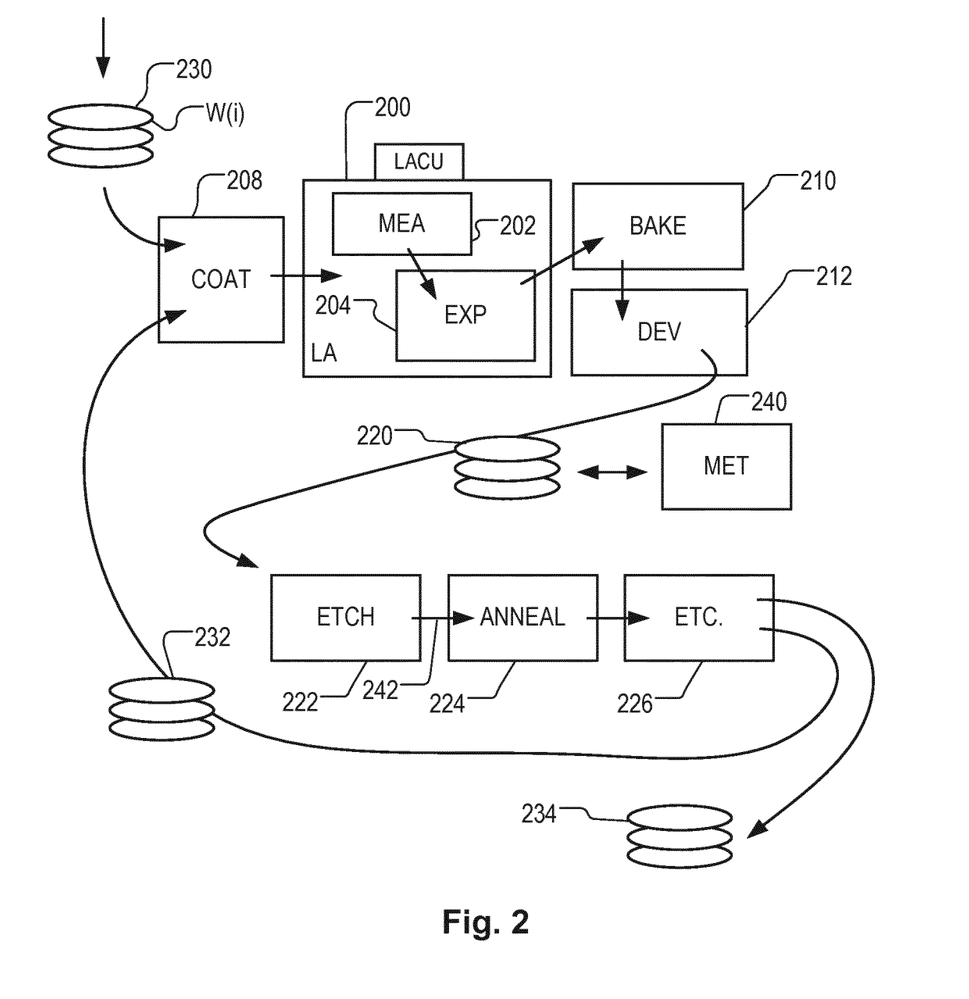
FIG. 2 shows schematically the use of the lithographic apparatus of FIG. 1 together with other apparatuses forming a lithographic production system for semiconductor devices, the system further including diagnostic apparatus according to embodiments of the present invention.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

Also shown in FIG. 2 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results from the apparatus 240 can be used to maintain accurate performance of the patterning operations in the litho cluster, by making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Referring back to FIG. 1, the substrate supports WTa/WTb degrade over time because of the effects of chemical residues from earlier processing steps on the substrate, and more general frictional wear of the repeated clamping and unclamping of substrates on the substrate supports. A badly deteriorated substrate support will result in defects in the imaged pattern and therefore a reduction of yield. Consequently, it is important to replace the substrate supports (or perform another suitable maintenance action such as cleaning of the substrate support) before deterioration affects yield. However, replacement of substrate supports results in significant apparatus downtime (and cost) and therefore it is not a task that should be undertaken with unnecessary frequency. It would also be of great benefit to be able to foresee when such maintenance will be required such that necessary preparations can be made for the consequent downtime and its effects mitigated.

It is proposed to use level sensor measurement data (height variation data) to monitor changes over time which result from substrate support deterioration (primarily) and/or contamination. In particular, it is proposed to monitor changes over time of residual data comprising the residual of the level sensor data and a regression fit of the clamped substrate shape. Such residual data may be deconvolved based on known features (e.g., of the substrate support). In this way, the residual of the regressed fit to level sensor data can be processed, using a series of Gaussian based filters, to gain insight into how substrate support signatures change over time.

A level sensor apparatus, (for example an ultra violet level sensor or UVLS) performs leveling metrology, and may measure more than 213,000 measurement points per substrate. To effectively and accurately model a dataset of this size, a regression may be made to characterize the dataset more efficiently. By way of a specific example, the regression may comprise a local regression nonparametric equation with k-nearest neighbor search.

The residual data may be determined by subtracting the regressed fit of the clamped substrate shape from the level sensor data, thereby revealing the underlying substrate support signatures. Subsequent to this, it is proposed that this residual data is deconvolved using knowledge of the substrate support design/or signature effects into deconvolved signatures of known underlying structures. The knowledge of the table design and/or areas having different signature effects may comprise knowledge of the spacing between known objects, such as burls and/or the location of the substrate edge (which may be defined as the substrate area outside a circumference 100 mm-140 mm from the substrate center; e.g. at 100 mm from the substrate center, at 120 mm from the substrate center, or at 140 mm from the substrate center) with respect to the remainder of the substrate (the substrate center). This may be done by applying one or more filters to deconvolve the residual data. The filters may comprise, for example, a series of Gaussian based filters, optimized with knowledge of substrate support design and/or signature effects. Once separated into individual sub groups, a method of monitoring small changes in their signatures over time is proposed.

To isolate process and device effects from the monitoring of the substrate support signatures, it would be best practice to, on occasion, measure substrates without any device or process stack. It would be valuable to monitor the signatures of both a reference substrate set along with production substrate sets from a given lithographic apparatus. For example, the residuals from 1 lot (25 substrates total) can be averaged per substrate support (e.g., 12 substrates from table 1 and 13 substrates form table 2), such that the signatures which are unique to each substrate support can be isolated.

Figure 3:
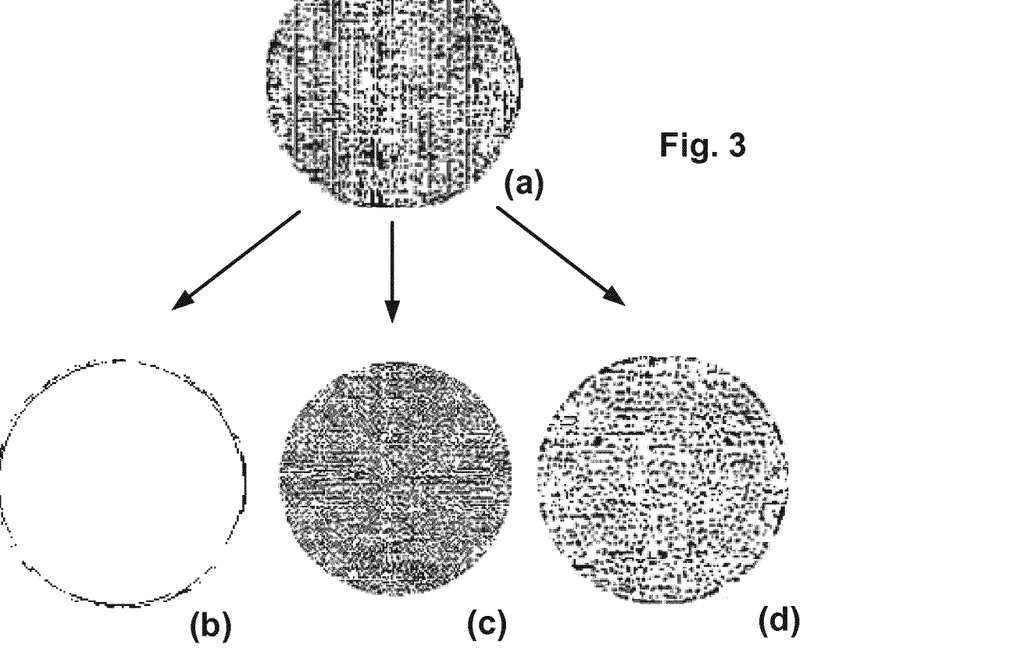
FIG. 3 shows (a) residual data from a regression of height variation data, and signatures deconvolved from this average residual data comprising (b) an edge signature, (c) a center burl signature and (d) a center other signature.

In a specific embodiment, the residual data is deconvolved into three deconvolved table signatures or sub-groups. FIG. 3 illustrates this. FIG. 3(a) is the residual data, which may comprise an average residual (e.g., per substrate support) over a number of substrates. The three deconvolved signatures or sub-groups comprise (b) a substrate edge signature (>140 mm from center of table for example) and two substrate center signatures. The center (<140 mm from center of table) signature is therefore broken down into: (c) a "center burl" (high frequency) signature and the remaining (d) "center other", lower frequency signature. Deconvolution into these specific signatures is purely exemplary. For example, in principle, it would be possible to further deconvolve the center other signature. An example of this may comprise deconvolving a radial signature (concentric rings signature), which can be seen in the residual data and "center other" signature.

Figure 4:
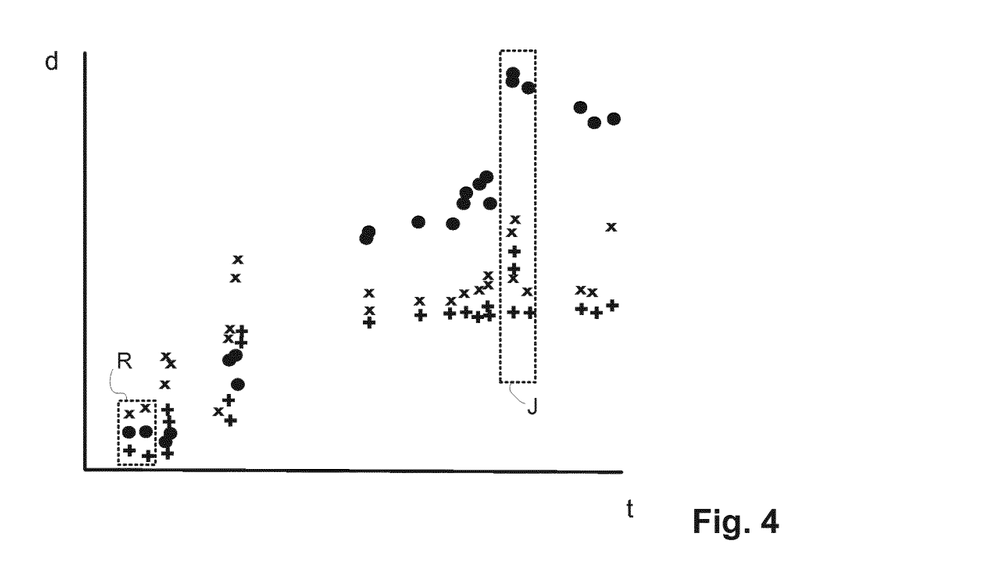
FIG. 4 is a plot of a distance metric d on the y-axis against time t on the x-axis, showing the rate of change of the substrate support deconvolved signatures over time.

In FIG. 4 shows a plot illustrating the rate of change in the deconvolved sub-groups, in terms of a similarity or distance metric d (e.g. Euclidean distance) between each individual point and a reference point, over time t. As such, pairwise distance between observations is used to generate a single value KPI per sub-group, the variation of which can be monitored over time. In the specific example shown, the reference point comprises an average signature over a number of points for the substrates of the first two lots R, although this is an arbitrary example. The data shows that the table edge signature changes at a greater rate than the table edge center. Also, it can be seen that the distance metric for the center subgroups tend to level off and remain relatively flat after a first general increase. By monitoring this distance metric (or, more generally, the change in one or more of the substrate support signatures), a change generally indicative of deterioration of the substrate support can be monitored over time. If the distance metric begins to approach a threshold, for example, it may be taken to be indicative that the substrate support will require replacement or other maintenance action. This can then be properly scheduled, and the consequent downtime mitigated by, for example, ensuring that there is sufficient production capacity on another lithographic apparatus in a facility.

In monitoring the distance metric, one or more instances of a jump J or spike may be observed. This may be an indication of contamination on the substrate support. If such a jump is observed, in an embodiment, a monitor substrate may then be measured to determine whether the jump is lot specific, or due to the table (in which case a table cleaning action may be initiated). Observation of the corresponding relevant signatures relating to the spike may also indicate the location of the contamination. It proposed, in an embodiment, to use this, with detail of the level sensor data to determine in-die product layout with respect to the contamination. By doing this, it is possible to determine the number of dies that could be effected by contamination, and therefore estimate the possible impact of contamination on yield.

Figure 5:
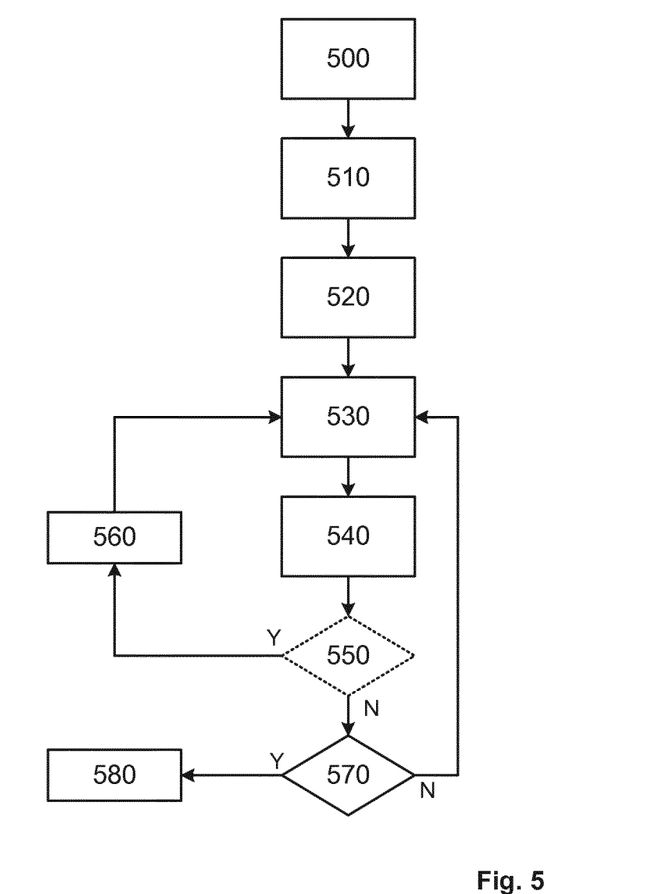
FIG. 5 is a flowchart describing an embodiment of the invention.

FIG. 5 is a flowchart describing a method for monitoring one or more substrate support signatures, and in particular to monitor such signatures to determine substrate support degradation and/or contamination. The method may comprise the following steps:

At step 500, height variation data of one or more monitor or reference substrates is measured, for example by using a level sensor apparatus. These monitor substrates may be measured without any other processing or exposure having been performed on them.

At step 510, a regression is fitted through the height variation data, and monitor residual data comprising the residual between the height sensor data from the monitor substrates and the regression is determined. The monitor residual data may be averaged (per substrate support) over a number of substrates.

At step 520, the monitor residual data is deconvolved (e.g., by application of suitable filters) to establish a plurality of sub-groups. In a specific example the plurality of sub-groups may comprise an edge sub-group, a center burl sub-group and a center other sub-group.

Production substrates are then measured 530 to obtain production height variation data, from which production residual data is derived, in a manner analogous to steps 500 and 510.

At step 540, the production residual data is deconvolved and monitored in real time. This may comprise determining a distance metric for each sub-group relative to a reference determined from production residual data from one or more initial production substrates/lots (e.g., an average over the first two lots) and/or from the monitor residual data. This step is looped throughout processing and exposure of the production lots, and should be product independent.

At decision 550 it is determined whether the monitor substrates should be re-measured. If so, at step 560, the monitor substrates are cycled through the lithographic apparatus and re-measured 560 to benchmark any changes with respect to the reference baseline. This may be done periodically, or triggered as a result of monitoring of the deconvolved product residual data (e.g., a jump being detected).

At decision 570 it is determined whether a maintenance action is required. If so, at step 580 the maintenance action is performed (e.g., schedule a substrate support replacement). If not, the method returns to step 530 such that production residual data is measured, deconvolved and monitored throughout the production process.

In an embodiment, it is also possible to vectorize the deconvolved residual data to obtain an equivalent (XY gradient) vector map. This may be done, for example, using the following equation:

$$\nabla F = \frac{\partial F}{\partial x}\hat{i} + \frac{\partial F}{\partial y}\hat{j}$$

Wherein F(x,y) represents the value of the residual data as a function of the x,y coordinates on the substrate. This vector map can then be used to determine impact of any substrate support changes on overlay.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments are disclosed in the list of numbered embodiments below:

1. A method for monitoring a lithographic process, comprising:
   obtaining height variation data relating to a substrate supported by a substrate support;
   fitting a regression through the height variation data, said regression approximating the shape of the substrate;
   determining residual data representing the difference between the height variation data and the regression; and
   monitoring variation of said residual data over time.
2. A method according to embodiment 1, comprising deconvolving said residual data based on known features of the substrate support to obtain deconvolved residual data, said monitoring step comprising monitoring the deconvolved residual data.
3. A method according to embodiment 2, wherein said deconvolved residual data comprises at least one sub-group relating to the substrate edge and at least one sub-group relating to the substrate center.
4. A method according to embodiment 3, wherein said substrate edge comprises the area outside a circumference located further than 120 mm from the substrate center.
5. A method according to embodiment 4, wherein said substrate edge comprises the area outside a circumference 140 mm from the substrate center.
6. A method according to any of embodiments 3 to 5, wherein said at least one sub-group relating to the substrate center is deconvolved into a first center sub-group relating to the location of burls on the substrate support and a second center sub-group relating to the remainder of the residual data of the substrate center.
7. A method according to any of embodiments 2 to 6, wherein said step of deconvolving said residual data comprises applying at least one filter to said residual data.
8. A method according to any preceding embodiment, comprising the step of scheduling a maintenance action based on said monitoring variation of the residual data over time.
9. A method according to embodiment 8, wherein the maintenance action comprises replacing the substrate support.
10. A method according to embodiment 8 or 9, wherein said step of monitoring variation of said residual data over time comprises determining and monitoring variation of a distance metric relative to reference residual data obtained from one or more initial height variation measurements.
11. A method according to embodiment 10, wherein the maintenance action is scheduled when said residual data is observed to drift a predetermined distance from said reference residual data according to said distance metric.
12. A method according to embodiment 8, comprising, where an event is observed in the residual data indicating contamination, said maintenance action comprises cleaning the substrate support.

13. A method according to embodiment 12, wherein said event comprises a spike in the residual data over time.
14. A method according to embodiment 12 or 13, comprising:
determining the location of the contamination with respect to a product layout being applied by said lithographic process; and
determining the impact of the contamination on yield.
15. A method according to any preceding embodiment, comprising an initial step of obtaining monitor height variation data relating to at least one monitor substrate supported by the substrate support, the monitor substrate having no product applied to it by the lithographic process.
16. A method according to embodiment 15, comprising re-measuring monitor height variation data on said at least one monitor substrate during production.
17. A method according to embodiment 16, wherein said re-measured monitor height variation data is used to identify and remove and/or compensate for any effects on variation of said residual data over time attributable to processing effects and/or effects of product applied by the lithographic process.
18. A method according to embodiment 16 or 17, wherein said re-measured monitor height variation data is used to determine whether an event in said residual data is specific to a lot, or attributable to the substrate support or contamination thereon.
19. A method according to any preceding embodiment, comprising the steps of vectorizing the residual data to obtain an equivalent vector map, and using the vector map to determine the impact of any substrate support changes on overlay.
20. A method according to any preceding embodiment, wherein the lithographic apparatus comprises a plurality of substrate supports, and the method is performed separately per substrate support.
22. A method according to any preceding embodiment, comprising the step of measuring said substrate using a level sensor apparatus to obtain said height variation data.
23. A lithographic apparatus, comprising:
a level sensor operable to measure height variation data relating to a substrate;
a substrate support operable to support said substrate; and
a processor operable to:
fit a regression through the height variation data, said regression approximating the shape of the substrate;
determine residual data representing the difference between the height variation data and the regression; and
monitor variation of said residual data over time.
24. A lithographic apparatus according to embodiment 23, wherein the processor is further operable to deconvolve said residual data based on known features of the substrate support to obtain deconvolved residual data, and to monitor the deconvolved residual data.
25. A lithographic apparatus according to embodiment 24, wherein said deconvolved residual data comprises at least one sub-group relating to the substrate edge and at least one sub-group relating to the substrate center.
26. A lithographic apparatus according to embodiment 25, wherein said substrate edge comprises the area outside a circumference greater than 120 mm from the substrate center.
27. A lithographic apparatus according to embodiment 26, wherein said substrate edge comprises the area outside a circumference 140 mm from the substrate center.
28. A lithographic apparatus according to any of embodiments 25 to 27, wherein the processor is further operable to deconvolve said at least one sub-group relating to the substrate center into a first center sub-group relating to the location of burls on the substrate support and a second center sub-group relating to the remainder of the residual data of the substrate center.
29. A lithographic apparatus according to any of embodiments 24 to 28, wherein the processor is further operable to deconvolve said residual data by applying at least one filter to said residual data.
30. A lithographic apparatus according to any of embodiments 23 to 29, wherein the processor is further operable to schedule a maintenance action based on said monitoring variation of the residual data over time.
31. A lithographic apparatus according to embodiment 30, wherein the maintenance action comprises replacing the substrate support.
32. A method according to embodiment 30 or 31, wherein said processor is operable, when monitoring variation of said residual data over time, to determine and monitor variation of a distance metric relative to reference residual data obtained from one or more initial height variation measurements.
33. A method according to embodiment 30, wherein the processor is operable to schedule the maintenance action when said residual data is observed to drift a predetermined distance from said reference residual data according to said distance metric.
34. A lithographic apparatus according to embodiment 30, comprising, where an event is observed in the residual data indicating contamination, said maintenance action comprises cleaning the substrate support.
35. A lithographic apparatus according to embodiment 34, wherein said event comprises a spike in the residual data over time.
36. A lithographic apparatus according to embodiment 34 or 35, wherein the processor is further operable to:
determine the location of the contamination with respect to a product layout being applied by said lithographic apparatus; and
determine the impact of the contamination on yield.
37. A lithographic apparatus according to any of embodiments 23 to 36, being operable to measure monitor height variation data relating to at least one monitor substrate supported by the substrate support, the monitor substrate having no product applied to it by the lithographic apparatus.
38. A lithographic apparatus according to embodiment 37, being operable to re-measure monitor height variation data on said at least one monitor substrate during production.
39. A lithographic apparatus according to embodiment 38, wherein said processor is operable to use said re-measured monitor height variation data to identify and remove and/or compensate for any effects on variation of said residual data over time attributable to processing effects and/or effects of product applied by the lithographic apparatus.
40. A lithographic apparatus according to embodiment 38 or 39, wherein said processor is operable to use said re-measured monitor height variation data to determine whether an event in said residual data is specific to a lot, or attributable to the substrate support or contamination thereon.

41. A lithographic apparatus according to any of embodiments 23 to 40.

42. A lithographic apparatus according to any of embodiments 23 to 41, wherein said processor is operable to vectorize the residual data to obtain an equivalent vector map, and use the vector map to determine the impact of any substrate support changes on overlay.

43. A lithographic apparatus according to any of embodiments 23 to 42, comprising a plurality of substrate supports, and the processor is operable to separately monitor variation of corresponding residual data over time for each substrate support.

44. A computer program product or other non-transient memory device, having stored there on software that when run on a computer causes the computer to carry out the steps of the method of any of embodiments 1 to 22.

The breadth and scope of the present invention should not be limited by any of the above-described exemplary embodiments, but should be defined only in accordance with the following claims and their equivalents.

The invention claimed is:

1. A method for monitoring a lithographic process, the method comprising:
    obtaining height variation data relating to a substrate supported by a substrate support;
    fitting a regression through the height variation data, the regression approximating the shape of the substrate;
    determining residual data representing a difference between the height variation data and the regression;
    deconvolving the residual data based on known features of the substrate support to obtain deconvolved residual data; and
    monitoring deconvolved residual data over time.

2. The method as claimed in claim 1, wherein the deconvolved residual data comprises at least one sub-group relating to the substrate edge and at least one sub-group relating to the substrate center.

3. The method as claimed in claim 2, wherein the at least one sub-group relating to the substrate center is deconvolved into a first center sub-group relating to the location of burls on the substrate support and a second center sub-group relating to the remainder of the residual data of the substrate center.

4. The method as claimed in claim 1, wherein the deconvolving the residual data comprises applying at least one filter to the residual data.

5. The method as claimed in claim 1, further comprising scheduling a maintenance action based on the monitoring.

6. The method as claimed in claim 5, wherein the maintenance action comprises replacing the substrate support.

7. The method as claimed in claim 5, wherein, responsive to an observation of an event in the residual data indicating contamination, the maintenance action comprises cleaning the substrate support.

8. The method as claimed in claim 7, wherein the event comprises a spike in the residual data over time.

9. The method as claimed in claim 7, further comprising:
    determining the location of the contamination with respect to a product layout being applied by the lithographic process; and
    determining the impact of the contamination on yield.

10. The method as claimed in claim 5, wherein the monitoring comprises determining and monitoring variation of a distance metric relative to reference residual data obtained from one or more initial height variation measurements.

11. The method as claimed in claim 10, wherein the maintenance action is scheduled when the residual data is observed to drift a predetermined distance from the reference residual data according to the distance metric.

12. The method as claimed in claim 1, further comprising an initial step of obtaining monitor height variation data relating to at least one monitor substrate supported by the substrate support, the monitor substrate having no product applied to it by the lithographic process.

13. The method as claimed in claim 12, further comprising re-measuring monitor height variation data on said at least one monitor substrate during production.

14. The method as claimed in claim 13, further comprising, based on the re-measured monitor height variation data, identifying and removing and/or compensating for any effects on variation of the residual data over time attributable to processing effects and/or effects of a product applied by the lithographic process.

15. The method as claimed in claim 13, further comprising, based on the re-measured monitor height variation data, determining whether an event in the residual data is specific to a lot, or attributable to the substrate support or contamination thereon.

16. The method as claimed in claim 1, further comprising vectorizing the residual data to obtain an equivalent vector map, and using the vector map to determine the impact of any substrate support changes on overlay.

17. A lithographic apparatus, comprising:
    a level sensor configured to measure height variation data relating to a substrate;
    a substrate support operable to support the substrate; and
    a processor configured to at least:
        fit a regression through the height variation data, the regression approximating the shape of the substrate;
        determine residual data representing a difference between the height variation data and the regression;
        deconvolve the residual data based on known features of the substrate support to obtain deconvolved residual data; and
        monitor deconvolved residual data over time.

18. A non-transitory computer program product having stored therein software, the software, upon execution by a computer system, configured to cause the computer system to at least:
    obtain height variation data relating to a substrate supported by a substrate support;
    fit a regression through the height variation data, the regression approximating the shape of the substrate;
    determine residual data representing the difference between the height variation data and the regression;
    deconvolve the residual data based on known features of the substrate support to obtain deconvolved residual data; and
    monitor deconvolved residual data over time.

19. The computer program product of claim 18, wherein the deconvolved residual data comprises at least one sub-group relating to the substrate edge and at least one sub-group relating to the substrate center.

20. The computer program product of claim 18, wherein the instructions are further configured to cause the computer system to schedule a maintenance action based on the monitoring.

* * * * *